United States Patent
Hara et al.

(10) Patent No.: US 6,875,324 B2
(45) Date of Patent: Apr. 5, 2005

(54) SPUTTERING TARGET MATERIAL

(75) Inventors: Noriaki Hara, Kanagawa-ken (JP); Somei Yarita, Kanagawa-ken (JP); Ken Hagiwara, Kanagawa-ken (JP); Ritsuya Matsuzaka, Kanagawa-ken (JP)

(73) Assignee: Tanaka Kikinzoku Kogyo K.K. (JP)

(*) Notice: Subject to any disclaimer, the term of this patent is extended or adjusted under 35 U.S.C. 154(b) by 350 days.

(21) Appl. No.: 10/092,465

(22) Filed: Mar. 8, 2002

(65) Prior Publication Data
US 2004/0079635 A9 Apr. 29, 2004

Related U.S. Application Data

(63) Continuation-in-part of application No. 09/463,967, filed as application No. PCT/JP99/03194 on Jun. 16, 1999, now abandoned.

(30) Foreign Application Priority Data

Jun. 17, 1998 (JP) .......................................... 10-185713

(51) Int. Cl.[7] .............................................. C23C 14/34
(52) U.S. Cl. ........................... 204/298.12; 204/298.13; 148/430; 420/461; 420/462; 420/466
(58) Field of Search ....................... 204/298.12, 298.13; 148/430; 420/461, 462, 466

(56) References Cited

U.S. PATENT DOCUMENTS

| 4,274,926 A | 6/1981 | Simon et al. |
| 5,324,406 A | 6/1994 | Anderson et al. ....... 204/224 R |
| 5,936,257 A | 8/1999 | Kusunoki et al. ............. 257/10 |

FOREIGN PATENT DOCUMENTS

| EP | 286175 | 10/1988 |
| JP | 4-333587 | 11/1992 |
| JP | 7-332494 | 12/1995 |
| JP | 8-67974 | 3/1996 |
| JP | 8-250427 | 9/1996 |
| JP | 9-41131 | 2/1997 |
| JP | 11-158612 | 6/1999 |

OTHER PUBLICATIONS

Hackh's Chemical Dictionary, p 543.

*Primary Examiner*—Rodney G. McDonald
(74) *Attorney, Agent, or Firm*—Rothwell, Figg, Ernst & Manbeck, P.C.

(57) ABSTRACT

The present invention is directed to a precious metal sputtering target having a columnar crystallographic microstructure such that crystals are grown in a direction normal to the sputtering surface in order to solve conventional problems. The high-purity sputtering target of the present invention prevents chipping of a minute cluster mass that occurs in a sputtering target produced through casting or powder metallurgy; produces thin film of excellent quality; and has considerably reduced internal defects.

10 Claims, 9 Drawing Sheets

SPUTTERING TARGET MATERIAL

CROSS-REFERENCE TO OTHER APPLICATIONS

This application is a continuation-in-part of U.S. application Ser. No. 09/463,967, filed on Feb. 11, 2000, now abandoned, which is a 371 of PCT/JP99/03194, filed on Jun. 16, 1999, and which is a PCT application of JP 185713/1998, filed on Jun. 17, 1998.

FIELD OF THE ART

The present invention relates to a sputtering target material, and more particularly to a sputtering target material comprising platinum and iridium.

BACKGROUND OF THE INVENTION

Recently, thin film made of a precious metal such as ruthenium or iridium has frequently been used in a thin-film electrode formed on a wafer of a semiconductor device.

Such thin film is most commonly produced through sputtering, which is a physical vapor deposition method. When thin film is produced through sputtering, the characteristics of the formed thin film vary considerably with the characteristics of a sputtering target material, such as purity and microstructure.

Thus, characteristics, such as specific resistance, which are required of a thin-film electrode in practice can be determined simply through control of the purity of a sputtering target material. In this connection, conventionally employed sputtering target materials which have been produced through casting or powder metallurgy have yielded reasonably satisfactory characteristics.

However, during use of a sputtering target produced through casting or powder metallurgy, a minute cluster mass tends to be chipped from the sputtering target and adhere on the formed thin film surface, to thereby cause, for example, a change in electrical resistance, which is detrimental to product quality and results in a reduction in product yield.

Meanwhile, when a sputtering target material is produced through powder metallurgy, the target material is typically hot-shaped under hydrostatic pressure through an HIP method. Particularly, intergranular voids may remain in the thus-produced sputtering target material, and gas may be trapped in the voids. Once the trapped gas is released, the gas affects the stability of vacuum which is required during sputtering, and may deteriorate film characteristics.

In addition, if such a sputtering target material having gas-trapping voids is heated during sputtering, the gas remaining in the sputtering target material expands by heat, to thereby possibly cause damage to the sputtering target per se, in forms such as blow-holes.

SUMMARY OF THE INVENTION

In order to solve the aforementioned problems involved in the prior art, an object of the present invention is to provide a high-purity precious metal sputtering target material which inhibits chipping of a minute cluster mass; provides excellent film characteristics; and has considerably reduced internal defects.

BRIEF DESCRIPTION OF THE DRAWINGS

FIG. 8($b$) shows the surface roughness profile of the sputtering surface after completion of sputtering.

FIG. 9($b$) shows the surface roughness profile of the sputtering surface after completion of sputtering.

DETAILED DESCRIPTION OF THE INVENTION

The present inventors have posited that the crystallographic microstructure which a sputtering target material possesses must carefully be considered so as to prevent chipping of a minute cluster mass, which is one of the conventional problems, to thereby attain the invention. Thus, in describing the present invention, it is very important to have considered the mechanism of chipping a minute cluster mass from a conventional sputtering target material which is produced through casting or powder metallurgy.

Accordingly, a description will first be given of the inventors' understanding of problems involved in a conventional sputtering target material. Then, solution of the problems by use of the sputtering target material of the present invention on the basis of the understanding will be elucidated. The sputtering target material of the present invention will thus be described hereinbelow.

Figure 2:
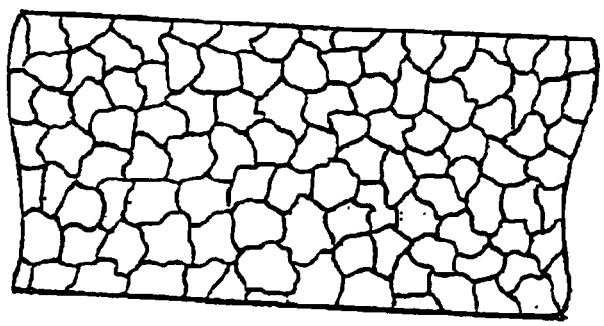
FIG. 2 is a schematic diagram of a cross-sectional crystallographic microstructure of a sputtering target material produced through casting.

It is very clear that a conventional sputtering target material which is produced through casting or powder metallurgy comprises innumerable crystals of a constituent metal. FIG. 2 schematically shows a cross-sectional view of a crystallographic microstructure of a sputtering target material which is produced through casting.

In the sputtering surface of a sputtering target material having a crystallographic microstructure as shown in FIG. 2, different crystal faces of different crystal orientations are distributed at random. Briefly, the sputtering surface assumes a polycrystalline state. This state is substantiated by the fact that analysis of the X-ray diffraction spectrum of the sputtering target material reveals (100), (002), (110), and (112) faces in proportions approximately the same as those obtained in an X-ray diffraction spectrum of a standard sample.

When sputtering is carried out by use of the sputtering target material having a polycrystalline sputtering surface and sputtering ions such as oxygen ions, nitrogen ions, and argon ions, the sputtering rate varies depending on the species of the sputtering ions and the crystal face orientation of a crystal which is developed to the surface. In other words, in a conventional sputtering target material having a sputtering surface where various crystal faces are developed, different crystal faces exhibit different specific sputtering rates, which justifies existence of a preferential sputtering surface, and crystals of a high sputtering rate and those of a low sputtering rate coexist.

On a microscopic level, as sputtering proceeds, crystal grains developing a crystal face which is easily sputtered are corroded vigorously, whereas those developing a crystal face which is not easily sputtered are corroded slowly, to thereby form depressions of different depths in the surface of the target material, making the surface rough. The phenomenon of roughening the surface of a sputtering target material becomes more remarkable with increasing sputtering rate, although the tendency depends on the employed sputtering ion species. Accordingly, the phenomenon is particularly noticeable when argon, widely used in industry due to its high sputtering rate, is used.

When sputtering is further continued, the surface of the sputtering target material is work-hardened through implantation of sputtering ions. Thus, crystal grains thinned by corrosion during sputtering are removed along a crystal grain boundary embrittled through work hardening, and fall off the surface of the sputtering target material to the surface of a formed thin film. Therefore, the aforementioned minute cluster mass can be regarded as crystal grains per se which are removed and fall off the target material.

Particularly, during roof sputtering; i.e., sputtering by use of a sputtering target disposed above a substrate on which thin film is formed, crystal grains are more liable to adhere on a substrate, through removal and fall off the grains. Therefore, resistance to chipping of a minute cluster mass from a sputtering target material is a critical quality requirement of a sputtering target material.

In order to solve the aforementioned problems involved in a conventional sputtering target material produced through casting or powder metallurgy, the present inventors have considered that the problems are solved through rendering the crystallographic microstructure of the precious metal sputtering target material of the present invention to a columnar microstructure. Specifically, the precious metal sputtering target material of the present invention is one having a columnar crystallographic microstructure in which crystals are grown in a direction normal to the sputtering surface.

Figure 1:
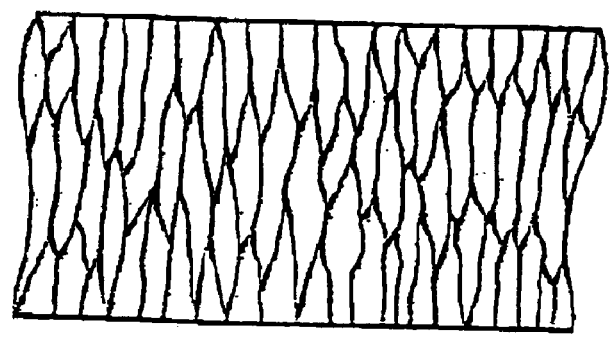
FIG. 1 is a schematic diagram of a cross-sectional crystallographic microstructure of a sputtering target material having a columnar crystallographic microstructure.

A sputtering target material having a columnar microstructure in which crystals are grown in a direction normal to the sputtering surface has a crystallographic microstructure such that crystals extend continuously in the thickness direction. The microstructure is schematically shown in FIG. 1. Therefore, there rarely arise problems involved in a conventional sputtering target material; i.e., chipping of minute crystal grains from a sputtering target material having a crystallographic microstructure such that crystals do not extend continuously in the thickness direction as shown in FIG. 2.

The columnar microstructure can be regarded as a microstructure in which crystals have been grown to a preferential orientation during crystal growth. Accordingly, through adjustment of the crystallographic microstructure of a material to be a columnar microstructure, a certain level of directional preference in crystal orientation can be provided to crystals constituting the material. Through the arrangement, the crystal orientation of a sputtering target material is aligned, to thereby mitigate microscopic-level local loss of the sputtering target material as much as possible.

Here, the columnar microstructure is a microstructure in which crystals have been grown to a preferential orientation, and, and the target material which consists of columnar microstructure has a desirable orientation. According to the present inventors, the preferential orientation changes with kinds of metal which constitutes target material.

According to the present inventors, when the metal which constitutes target material is platinum, the desirable preferential orientation is a (200) face. That is, in the platinum target according to the invention, the ratio of an integral intensity of the (200) face to that of another arbitrary crystal face as determined by X-ray diffractometry is greater than the ratio of the integral intensity of the (200) face of the platinum in a powder state to that of another arbitrary crystal face.

Moreover, when the metal which constitutes target material is ruthenium, the desirable preferential orientation is any of a (112) face, a (002) face, or a (004) face. That is, in the ruthenium target according to the invention, the ratio of an integral intensity of any of the (112) face, (002) face, or the (004) face to that of another arbitrary crystal face as determined by X-ray diffractometry is greater than the ratio of the integral intensity of the (112) face, (002) face, or the (004) face of the ruthenium in a powder state to that of another arbitrary crystal face.

Furthermore, when the metal which constitutes target material is iridium, the desirable preferential orientation is a (220) face. That is, in the iridium target according to the invention, the ratio of an integral intensity of the (220) face to that of another arbitrary crystal face as determined by X-ray diffractometry is greater than the ratio of the integral intensity of the (220) face of the iridium in a powder state to that of another arbitrary crystal face.

The precious metal sputtering target material of the present invention is characterized in that the target material has a crystallographic microstructure such that columnar crystals are grown in a direction normal to the sputtering surface. Thus, the sputtering target material can serve as a source of precious metal thin film having excellent characteristics without producing a minute cluster mass.

Meanwhile, some sputtering target materials made of a metal such as titanium are known to comprise columnar crystals as does the sputtering target material of the present invention. For example, columnar crystals are produced in a sputtering target material made of a metal such as titanium by regulating the heat flow during a post-melt solidification step in one direction (unidirectional solidification).

However, no research has been conducted for producing a precious metal sputtering target material comprising columnar crystals, and such a precious metal sputtering target material has never been reported. The reason for this is that a precious metal is a high-melting-point material and is difficult to produce through casting as described above. In practice, it is impossible to provide columnar crystals in a crystallographic microstructure of such a high-melting-point material through the aforementioned unidirectional solidification. Therefore, providing columnar crystals in a crystallographic microstructure of a precious metal sputtering target material is not conceivable from the state of the art.

Under such circumstances, the present inventors have conducted further studies in order to obtain a precious metal target material comprising columnar crystals, and have discovered a sputtering target material having a crystallographic microstructure comprising columnar crystals which are electrolytically deposited from a solution containing a precious metal salt.

The columnar crystals can be electrolytically deposited at relatively low temperature from a solution containing a precious metal salt, although the deposition rate is relatively slow. Thus, the above electrolytic method for producing a target material features easier control of production steps and more excellent production efficiency than does a conventional casting method. In addition, the thus-produced target material is advantageously inexpensive as compared with a conventional precious metal target material.

Since the electrolytically deposited columnar crystals are produced through selective deposition by use of difference in the deposition potential, which is one characteristic of an electrolysis technique, the columnar crystal of high purity contains low levels of impurities. Accordingly, the target material of the present invention is characterized in that the material of high purity contains very few internal defects.

In addition, in recent years, the diameter of a target material is required to increase in order to enhance productivity of thin film devices. The target material of the present invention can also meet the demand for increasing the diameter of a target material comparatively easily, by appropriately modifying conditions for electrolysis and deposition for producing columnar crystals. Thus, there can be produced a target material having a large diameter and comprising uniform columnar crystals, which material has never been produced through a conventional unidirectional solidification method.

The aforementioned solution containing a precious metal encompasses not only an aqueous solution containing a precious metal salt but also a salt mixture in a molten state incorporated with a precious metal salt.

Particularly, a target material comprising columnar crystals, which material is deposited from the aforementioned molten salt mixture, is preferred in view of purity and directivity of a crystal face. When electrolysis is carried out by use of a molten salt, the composition of the molten salt serving as an electrolyte is easily controlled. In addition, the difference in deposition potential between a precious metal of interest and an impurity can be employed effectively, to thereby selectively deposit high-purity precious metal. Furthermore, molten salt electrolysis enables direct production of a precious metal target material having a desirable shape within a comparatively short period of time as compared with deposition of a precious metal from an aqueous solution containing a precious metal salt, as well as control of the microstructure of a deposited material through appropriate modification of electrolysis conditions. Thus, a sputtering target material in which a columnar microstructure is grown can be produced.

BEST MODE FOR CARRYING OUT THE INVENTION

Embodiment 1: The precious metal sputtering target of the present invention will be described in more detail. First, in one embodiment, a precious metal target material was produced through electrolysis of an aqueous solution containing platinum.

The solution containing platinum serving as an electrolysis bath had the following composition.

TABLE 1

| Bath component | Concentration (g/l) |
| --- | --- |
| Potassium hexahydroxoplatinate | 30 |
| Potassium hydroxide | 60 |

A copper disk (diameter: 130 mm) was used as a cathode for depositing platinum. Prior to electrolysis, the cathode was electrolytically degreased, activated with an acid, and strike-plated with platinum. Subsequently, the cathode was immersed in the above aqueous solution to carry out electrolysis.

Electrodeposition of the molten salt was carried out under the following conditions: bath temperature of 95° C., cathodic current density of 3 A/dm$^2$, and a deposition time of 125 h, to thereby obtain a platinum deposit having a thickness of 3 mm. The substrate of platinum-deposited cathode; i.e., the copper plate, was dissolved, to thereby obtain disk-shaped platinum plates serving as platinum sputtering target materials. The crystallographic microstructure of the platinum sputtering target materials was analyzed through X-ray diffraction. The results indicate that the integral intensity of the (200) face is particularly greater than that of another arbitrary crystal face, and the ratio of the integral intensity of the (200) face to that of another arbitrary crystal face is greater for the platinum sputtering target material than for a powder platinum sample. Thus, the target material of the embodiment was proven to have a microstructure strongly oriented in the (200) face.

Embodiment 2: Another target material was produced from a molten salt mixture serving as a solution containing a precious metal to be deposited by means of an electrolysis apparatus 1.

Figure 3:
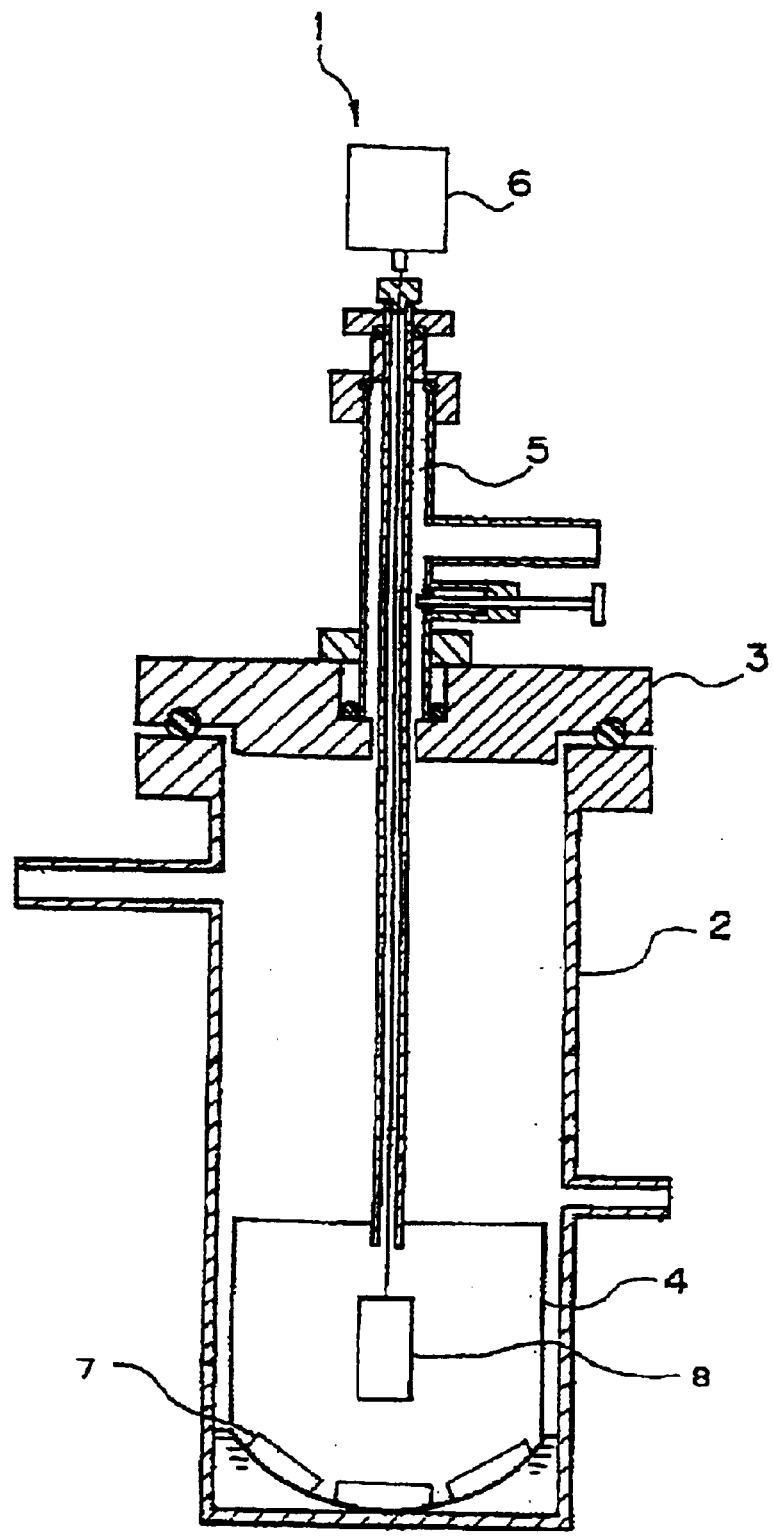
FIG. 3 is a schematic structural diagram of a molten salt electrolysis apparatus.

As shown in FIG. 3, the electrolysis apparatus 1 comprises a hollow cylindrical vessel 2 having an opening at the top; a flange 3 having an inlet for inserting an electrode and serving as a cap for the cylindrical vessel; a graphite-made electrolytic tank 4; an exhaust chamber 5 for inserting or removing a plated material; and rotating means 6 for rotating a plating substrate.

In the electrolysis apparatus 1 shown in FIG. 3, ruthenium plates 7 were used as anodes 7 disposed on the side the graphite-made electrolytic tank 4. These ruthenium plates were disposed such that they maintained contact with a bottom portion of the electrolytic tank 4. Electric current was supplied via the electrolytic tank 4 by use of rod-shaped graphite 8 as a cathode, to thereby perform electrolysis of a molten salt. The composition of the molten salt mixture for a ruthenium target material is shown in Table 2.

TABLE 2

| Salt component | Weight/g |
| --- | --- |
| sodium chloride | 1577.9 |
| potassium chloride | 1241.3 |
| cesium chloride | 6894.3 |
| potassium chlororuthenate | 765.1 |

Electrodeposition of the molten salt was carried out under the following conditions: bath temperature of 520° C., cathodic current density of 2 A/dm$^2$, and a deposition time of 150 h, to thereby obtain electrolytically deposited ruthenium having a thickness of 3 mm. The deposit was washed with an acid such as hydrochloric acid or sulfuric acid and removed from the graphite electrode, to thereby obtain disk-shaped ruthenium plates serving as ruthenium sputtering target materials.

Figure 4:
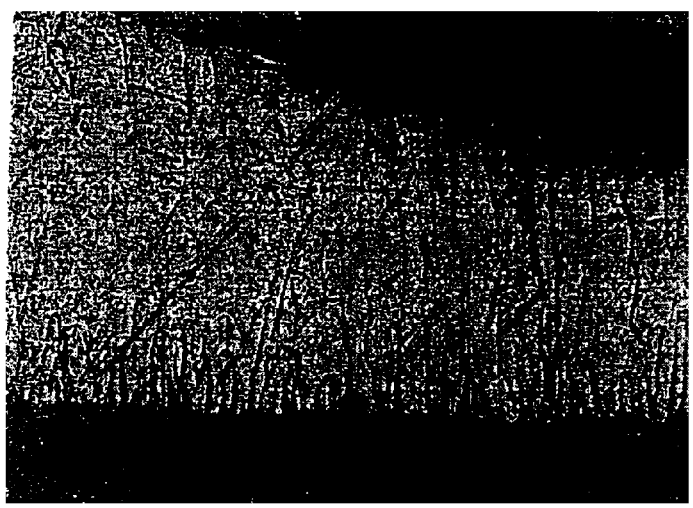
FIG. 4 shows the microstructure of grains as observed under an optical microscope showing a schematic diagram of a cross-sectional crystallographic microstructure of the ruthenium sputtering target material of the present invention.

Finally, each obtained ruthenium sputtering material was caused to adhere to a copper plate having a thickness of 3 mm, to thereby fabricate a ruthenium sputtering target. The crystallographic microstructure of the ruthenium target material was observed under a 100-power metallographic microscope. As shown in FIG. 4, a columnar crystallographic microstructure was identified. The ruthenium sputtering target materials was analyzed through X-ray diffraction. The results indicate that the integral intensity of the (122) face is particularly greater than that of another arbitrary crystal face, and that the ratio of the integral intensity of the (122) face to that of another arbitrary crystal face is greater for the ruthenium sputtering target material than for a powder ruthenium sample. Thus, the target material of the present embodiment was proven to have a microstructure such that crystals are strongly oriented in the (122) face. The presence of internal defects was investigated through X-ray radiography, and no internal defects were detected.

Embodiment 3: In Embodiment 3, while changing electrolysis conditions, a ruthenium target material was produced by use of the molten salt mixture having a composition shown in Table 2 as employed in Embodiment 2 and the electrolysis apparatus as shown in FIG. 3. Thus, since essential framework of this embodiment is the same as that in Embodiment 2, repetition of the description in relation to the method for production is omitted, and only conditions differing from those employed in Embodiment 2 will be described.

Electrodeposition of the molten salt was carried out under the following conditions: bath temperature of 530° C., cathodic current density of 3 A/dm$^2$, and a deposition time of 100 h, to thereby obtain an electrolytically deposited ruthenium film having a thickness of 3 mm.

The crystallographic microstructure of the ruthenium sputtering target materials was analyzed through X-ray diffraction. The ruthenium target material according to Embodiment 3 was found to show the same tendency as observed in Embodiment 1 for the (002) face, and strong orientation in the (002) face was proven. The presence of internal defects was investigated through X-ray radiography, and no internal defects were detected.

Embodiment 4: In Embodiment 4, while changing electrolysis conditions, a ruthenium target material was produced by use of the molten salt mixture having a composition shown in Table 2 as employed in Embodiment 2 and the electrolysis apparatus as shown in FIG. 3.

Electrodeposition of the molten salt was carried out under the following conditions: bath temperature of 520° C., cathodic current density of 2 A/dm$^2$, and a deposition time of 150 h, to thereby obtain an electrolytically deposited ruthenium film having a thickness of 3 mm.

The crystallographic microstructure of the ruthenium sputtering target materials was analyzed through X-ray diffraction. The ruthenium target material according to Embodiment 4 was found to show a strong orientation in the (004) face was proven. The presence of internal defects was investigated through X-ray radiography, and no internal defects were detected.

By use of the ruthenium target which had been produced in the aforementioned Embodiments 2 to 4, sputtering was carried out in practice. Sputtering was carried out in a manner of roof sputtering, and the ruthenium target was placed above a substrate to form thin film. The test was repeated (N=100), and there was observed no case in which crystal grains per se were removed and fell off to affect the performance of the thin film.

Embodiment 5: In Embodiment 5, an iridium target material was produced by use of the same molten salt electrolysis apparatus 1 shown in FIG. 3 as employed in Embodiments 1 and 2. In Embodiment 4, a molten salt mixture having a composition as shown in Table 3 was used.

TABLE 3

| Salt component | Weight/g |
| --- | --- |
| sodium chloride | 1420.0 |
| potassium chloride | 1643.8 |
| cesium chloride | 6894.3 |
| sodium chloroiridate | 426.5 |

Electrodeposition of the molten salt was carried out under the following conditions: bath temperature of 520° C., cathodic current density of 2 A/dm$^2$, and deposition time of 150 h, to thereby obtain an electrolytically deposited iridium film having a thickness of 3 mm. The electrodeposited iridium was washed with an acid such as hydrochloric acid or sulfuric acid and removed from the graphite electrode, to thereby obtain disk-shaped iridium plates serving as iridium sputtering target materials.

Figure 5:
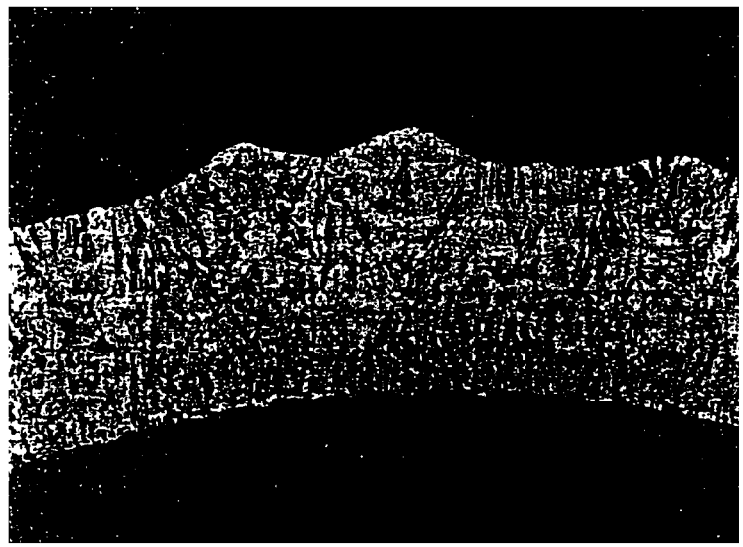
FIG. 5 shows the microstructure of grains as observed under an optical microscope showing a schematic diagram of a cross-sectional crystallographic microstructure of the indium sputtering target material of the present invention.

Finally, each obtained iridium sputtering target material was caused to adhere to a copper plate having a thickness of 3 mm, to thereby fabricate an iridium sputtering target. The crystallographic microstructure of the iridium target material was observed under a 100-power optical metallographic microscope. As shown in FIG. 5, a columnar crystallographic microstructure was identified. The crystallographic microstructure of the iridium sputtering target materials was analyzed through X-ray diffraction. The results indicate that the same tendency as observed in Embodiment 1 was identified for the (220) face, and strong orientation in the (220) face was proven. The presence of internal defects was investigated through X-ray radiography, and no internal defects were detected.

Subsequently, sputtering was carried out by use of the iridium target. Sputtering was carried out in a manner of roof sputtering, and the iridium target was placed above a substrate to form a thin film. The test was repeated (N=100), and there was observed no case in which crystal grains per se were removed and fell off to affect the performance of the thin film.

Further, for comparison with the sputtering target material of the present invention, sputtering was carried out by use of a ruthenium sputtering target material produced through casting, whereby the properties were compared with those of the sputtering target of the present invention. Sputtering was carried out in a manner of roof sputtering, and the ruthenium target was placed above a substrate to form a thin film. The test was repeated (N=100), and there were observed two cases in which crystal grains per se were removed and fell off to possibly affect the performance of the thin film. Although the damage sustained by the two samples was not critical, variation in electric resistance thereof was identified.

However, even though the variation is on the level as described above, it may cause a critical decrease in production yield and lower reliability of product quality in the semiconductor industry, where quality control is as fine as on a ppb level.

Figure 6:
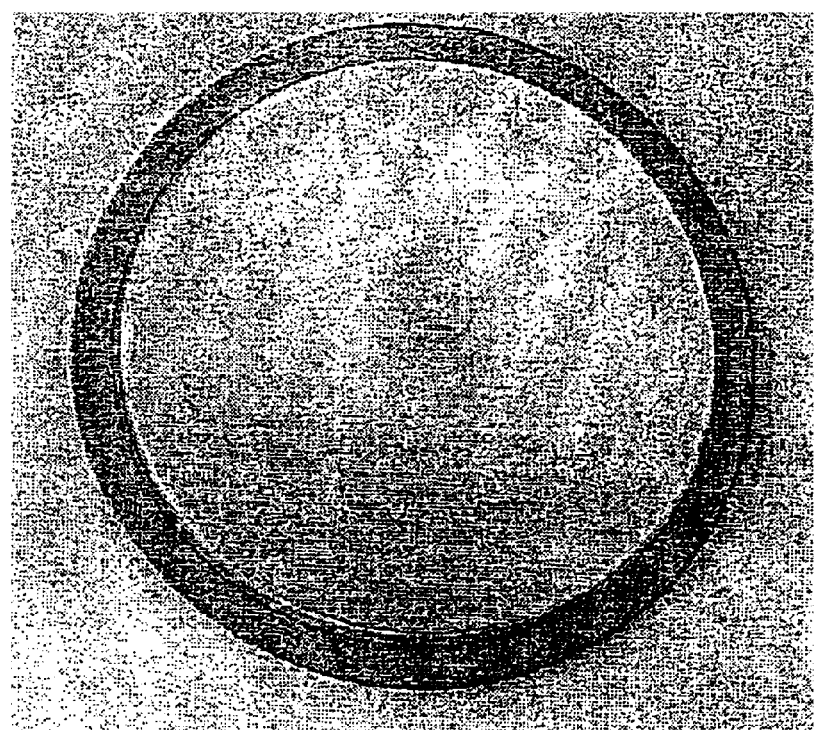
FIG. 6 shows the visually observed microstructure of grains at a surface of the ruthenium sputtering target material of the present invention after completion of sputtering.
Figure 7:
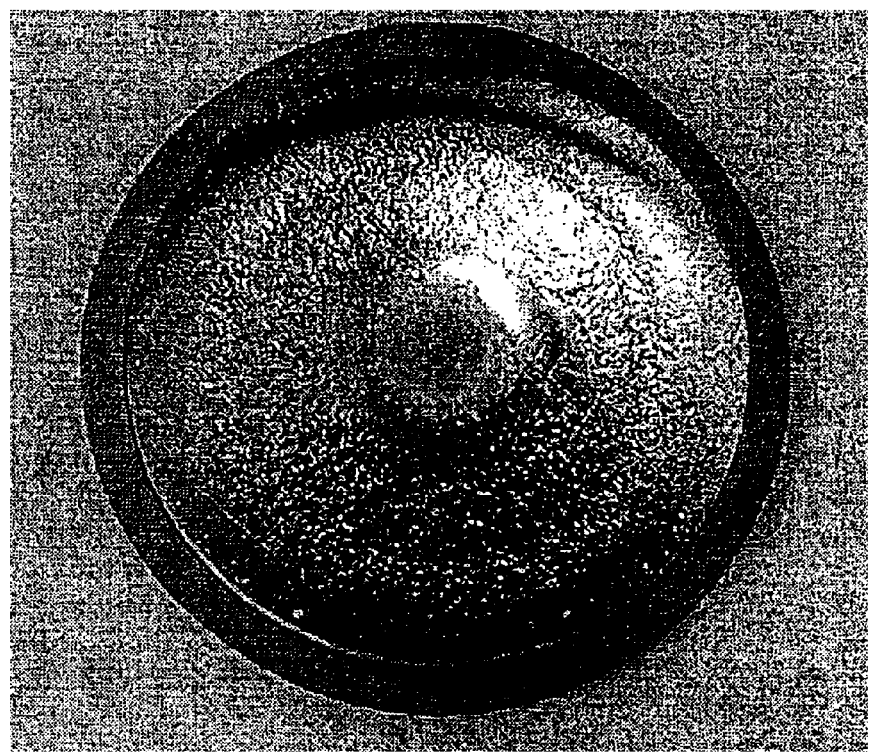
FIG. 7 shows the visually observed microstructure of grains at a surface of a ruthenium sputtering target material produced through casting.

After completion of sputtering by use of argon as a sputtering gas, the sputtering surfaces of the ruthenium target material of Embodiment 1 and the target material produced through the aforementioned casting method were observed. As is clear from FIGS. 6 and 7, as can be seen from even visual observation, the ruthenium target material produced through electrolysis of a molten salt shown in FIG. 6 was corroded more uniformly and had surface roughness lower than that of the ruthenium target material produced through casting shown in FIG. 7.

Figure 8A:
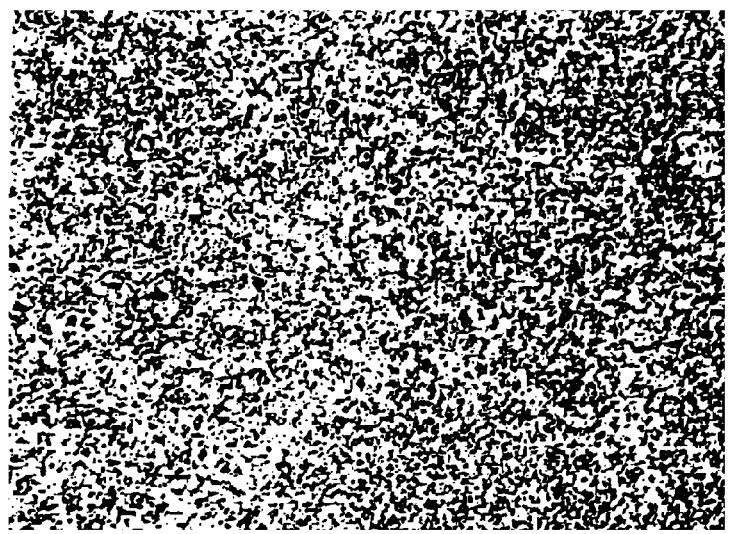
FIG. 8($a$) shows the crystallographic microstructure at a surface of the ruthenium sputtering target material of the present invention after completion of sputtering, as observed through SEM.
Figure 8B:
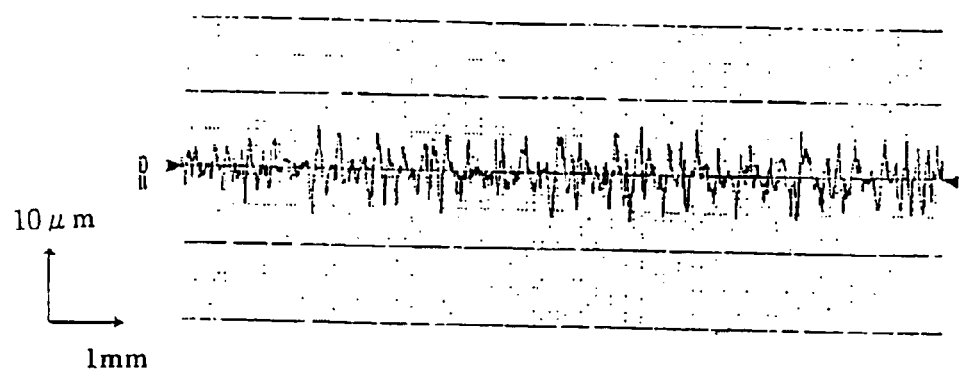
Figure 9A:
FIG. 9($a$) shows the crystallographic microstructure at a surface of a ruthenium sputtering target material produced through casting after completion of sputtering, as observed through SEM.
Figure 9B:
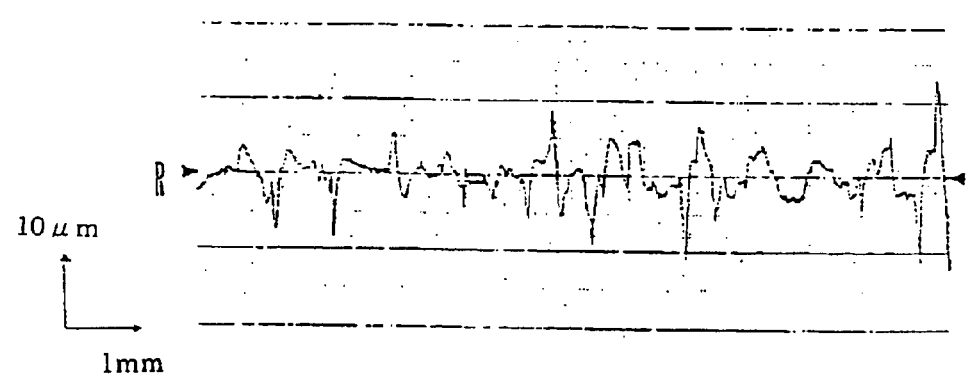

Furthermore, observation of the surfaces through SEM is shown in FIG. 8(a) and FIG. 9(a), and surface roughness profiles obtained by means of a surface roughness meter are shown in FIG. 8(b) and FIG. 9(b). As is clear also qualitatively, the ruthenium target material as shown in FIG. 8 has a uniform sputtering surface with reduced unevenness, as compared with the ruthenium target material as shown in FIG. 9. As is clear from the results, the sputtering target material produced through electrolysis of a molten salt comprises columnar crystal grains and plays a very important role in realizing constant operation.

What is claimed is:

1. A platinum sputtering target material, wherein said target material contains columnar crystals grown in a direction normal to a sputtering surface, and a ratio of an integral intensity of a (200) face to that of another arbitrary crystal face as determined by X-ray diffractometry is greater than the corresponding ratio as measured for a powder platinum sample.

2. A sputtering target material according to claim 1, wherein a crystallographic microstructure containing the columnar crystals is electrodeposited from a solution containing a precious metal salt.

3. A ruthenium sputtering target material, wherein said target material contains columnar crystals grown in a direction normal to a sputtering surface, and a ratio of an integral intensity of a (112) face to that of another arbitrary crystal face as determined by X-ray diffractometry is greater than the corresponding ratio as measured for a powder ruthenium sample.

4. A sputtering target material according to claim 3, wherein a crystallographic microstructure containing the columnar crystals is electrodeposited from a solution containing a precious metal salt.

5. A ruthenium sputtering target material, wherein said target material contains columnar crystals grown in a direction normal to a sputtering surface, and a ratio of an integral intensity of a (002) face to that of another arbitrary crystal face as determined by X-ray diffractometry is greater than the corresponding ratio as measured for a powder ruthenium sample.

6. A sputtering target material according to claim 5, wherein a crystallographic microstructure containing the columnar crystals is electrodeposited from a solution containing a precious metal salt.

7. A ruthenium sputtering target material, wherein said target material contains columnar crystals grown in a direction normal to a sputtering surface, and a ratio of an integral intensity of a (004) face to that of another arbitrary crystal face as determined by X-ray diffractometry is greater than the corresponding ratio as measured for a powder ruthenium sample.

8. A sputtering target material according to claim 7, wherein a crystallographic microstructure containing the columnar crystals is electrodeposited from a solution containing a precious metal salt.

9. An iridium sputtering target material, wherein said target material contains columnar crystals grown in a direction normal to a sputtering surface, and a ratio of an integral intensity of a (220) face to that of another arbitrary crystal face as determined by X-ray diffractometry is greater than the corresponding ratio as measured for a powder iridium sample.

10. A sputtering target material according to claim 9, wherein a crystallographic microstructure containing the columnar crystals is electrodeposited from a solution containing a precious metal salt.

* * * * *